(12) United States Patent
Huang et al.

(10) Patent No.: US 11,308,606 B2
(45) Date of Patent: Apr. 19, 2022

(54) DESIGN-ASSISTED INSPECTION FOR DRAM AND 3D NAND DEVICES

(71) Applicant: KLA CORPORATION, Milpitas, CA (US)

(72) Inventors: Junqing Huang, Fremont, CA (US); Hucheng Lee, Cupertino, CA (US); Sangbong Park, Dublin, CA (US); Xiaochun Li, San Jose, CA (US)

(73) Assignee: KLA CORPORATION, Milpitas, CA (US)

( * ) Notice: Subject to any disclaimer, the term of this patent is extended or adjusted under 35 U.S.C. 154(b) by 144 days.

(21) Appl. No.: 16/542,376

(22) Filed: Aug. 16, 2019

(65) Prior Publication Data

US 2021/0049755 A1    Feb. 18, 2021

(51) Int. Cl.
| | |
|---|---|
| *G06K 9/00* | (2006.01) |
| *G06T 7/00* | (2017.01) |
| *H01L 27/108* | (2006.01) |
| *H01L 27/11556* | (2017.01) |
| *G06T 7/11* | (2017.01) |
| *G01N 21/95* | (2006.01) |
| *G01N 21/956* | (2006.01) |
| *H01L 27/11582* | (2017.01) |

(52) U.S. Cl.
CPC ....... *G06T 7/0006* (2013.01); *G01N 21/9501* (2013.01); *G01N 21/956* (2013.01); *G06T 7/11* (2017.01); *H01L 27/10844* (2013.01); *H01L 27/11556* (2013.01); *H01L 27/11582* (2013.01); *G06T 2207/30148* (2013.01)

(58) Field of Classification Search
CPC ................... G01N 21/9501; G01N 21/956
See application file for complete search history.

(56) References Cited

U.S. PATENT DOCUMENTS

| | | | |
|---|---|---|---|
| 9,996,942 B2 | 6/2018 | Bhattacharyya et al. | |
| 2005/0273734 A1* | 12/2005 | Kamat | G06F 30/39 716/51 |
| 2009/0279090 A1 | 11/2009 | Wolf et al. | |
| 2011/0142327 A1* | 6/2011 | Chen | G06T 7/11 382/149 |
| 2016/0003609 A1* | 1/2016 | Shchegrov | G03F 7/705 356/625 |
| 2017/0167862 A1* | 6/2017 | Dziura | G01B 15/02 |
| 2017/0286589 A1 | 10/2017 | Huang et al. | |
| 2018/0277337 A1 | 9/2018 | Anantha et al. | |

FOREIGN PATENT DOCUMENTS

| | | |
|---|---|---|
| KR | 20130111548 A | 10/2013 |
| KR | 20180116383 A | 10/2018 |

OTHER PUBLICATIONS

WIPO, ISR for PCT/US2020/046257, Nov. 23, 2020.

* cited by examiner

*Primary Examiner* — Hadi Akhavannik
(74) *Attorney, Agent, or Firm* — Hodgson Russ LLP

(57) ABSTRACT

With the disclosed systems and methods for DRAM and 3D NAND inspection, an image of the wafer is received based on the output for an inspection tool. Geometric measurements of a design of a plurality of memory devices on the wafer are received. A care area with higher inspection sensitivity is determined based on the geometric measurements.

8 Claims, 8 Drawing Sheets

Calculated page break center

DESIGN-ASSISTED INSPECTION FOR DRAM AND 3D NAND DEVICES

FIELD OF THE DISCLOSURE

This disclosure relates to inspection of semiconductor devices.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield. Because of the nature of device process, the noise characteristics where defects reside and/or probability that a defect occurs are different depending on the geometrical distance to the certain design patterns. For example, the boundary of a DRAM or 3D NAND cell area tends to be much noisier than the inner cell area and the defect density tends to be much higher in the near boundary area. Therefore, a new strategy for defect detection related to the geometry location is needed.

Memory devices, such as dynamic random-access memory (DRAM) and 3D NAND devices, can be particularly difficult to inspect. Memory devices may lack the number of alignment targets present in a logic device. There also may not be an easy way to determine what a design is from an image of a memory device. For example, it may be difficult to find a structure's center or certain edges of a structure. Previously, inspection was performed with the same sensitivity across all structures. For DRAM, legacy array inspection was performed, which can be difficult to perform because semiconductor manufacturers may not share the design file for the DRAM device. Furthermore, the logic area around an array is often saturated due to light starving in the array regions. This can result in poor pixel-design alignment (PDA). There may be no differentiation between defects of interest (DOI) and nuisance with this technique.

FIG. 1 illustrates exemplary DRAM memory blocks, which include line and space patterns. An objective is to separate defects outside the trim (i.e., the thick, dotted line shown in the bottom right corner of FIG. 1). Each cell can have dimensions 300 on the scale of microns. The binning size 301 can be from tens to hundreds of nanometers or on the scale of microns. An objective can be to separate defects located on the cell edges (in both x and y) from the bulk of cells.

FIG. 2 illustrates exemplary DRAM memory blocks, which includes contact holes or plugs. Each cell can have dimensions 300 on the scale of microns. The binning size 301 can be from tens to hundreds of nanometers or on the scale of microns. An objective can be to separate the edge two contacts from the center. Another objective can be to separate defects located on the cell edges (in both x and y) from the bulk of cells Legacy array inspection also was performed for 3D NAND, but legacy array inspection cannot identify which contact rows the defect is coming from. 3D NAND cell inspection may not be able to use certain inspection techniques because of the large scale of the 3D NAND cells. Image-based inspection may be unable to handle process variation across a wafer with 3D NAND cells. DOIs can be separated at setup because DOIs from different contact rows may be mixed together when the classifier is applied to a whole wafer.

FIG. 3 illustrates an exemplary 3D NAND blocks, which includes contact holes or plugs. An objective can be to separate the edge two contacts from the center region and possibly to bin each row differently. Another objective can be to separate defects located on the edge row contacts from the inner row contacts. Peripheral (Peri) may provide good patterns, but is at a different height than the cell. Thus, the peripheral cannot be used for PDA. The dimensions for Cell1 and Cell2 in FIG. 3 can be on the scale of thousands of microns in the X-direction and Y-direction.

Therefore, what is needed are improved methods and systems for inspection of memory devices.

BRIEF SUMMARY OF THE DISCLOSURE

A system is provided in a first embodiment. The system includes an inspection tool and a processor in electronic communication with the inspection tool. The inspection tool includes an energy source configured to generate energy that is directed to a wafer and a detector configured to detect energy from the wafer and to generate output responsive to the energy that is detected. The processor is configured to: receive an image of the wafer based on the output; receive geometric measurements of a design of a plurality of memory devices on the wafer; and determine a care area with higher inspection sensitivity based on the geometric measurements.

In an instance, each of the memory devices is a 3D NAND cell. The geometric measurements can be one or more of a distance between contact rows, a distance between trenches, or a location of a dummy area. The processor can be configured to apply the care area to a contact row of the memory devices.

In an instance, each of the memory devices is a DRAM cell. The geometric measurements can be one or more of a cell outline distance to a center of a periphery. The care area can be applied to a trim area or an area with critical defects. The processor can be configured to apply the care area to the memory devices. The processor also can be further configured to: extend a job size in an X-direction to cover at least two array cells; determine a sub-swath that covers page breaks and identifies a cell boundary; and determine pattern-design alignment distortion and location of the cell boundary to another sub-swath without periphery intersections.

A method is provided in a second embodiment. The method comprises inspecting a wafer using an inspection tool; receiving, at a processor, an image of the wafer from the inspection tool; receiving, at the processor, geometric measurements of a design of a plurality of memory devices on the wafer; and determining, using the processor, a care area with higher inspection sensitivity based on the geometric measurements.

In an instance, each of the memory devices is a 3D NAND cell. The geometric measurements can be one or more of a distance between contact rows, a distance between trenches, or a location of a dummy area. The method can further include applying the care area to a contact row of the memory devices using the processor.

In an instance, each of the memory devices is a DRAM cell. The geometric measurements can be one or more of a cell outline distance to a center of a periphery. The care area can be applied to a trim area or an area with critical defects. The method can further include applying the care area to the memory devices using the processor. The method also can further include: extending a job size in an X-direction to cover at least two array cells using the processor; determining a sub-swath that covers page breaks and identifies a cell boundary using the processor; and determining pattern-design alignment distortion and location of the cell boundary to another sub-swath without periphery intersections using the processor.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein provide improved sensitivity for inspection of memory devices, such as DRAM and 3D NAND structures. Using the design-assisted inspection disclosed herein, different thresholds can be applied to different structures. Improved sensitivity for DRAM can be provided with limited design information from a semiconductor manufacturer. For 3D NAND, different contact rows can be separated with better sensitivity using design information.

Figure 1:
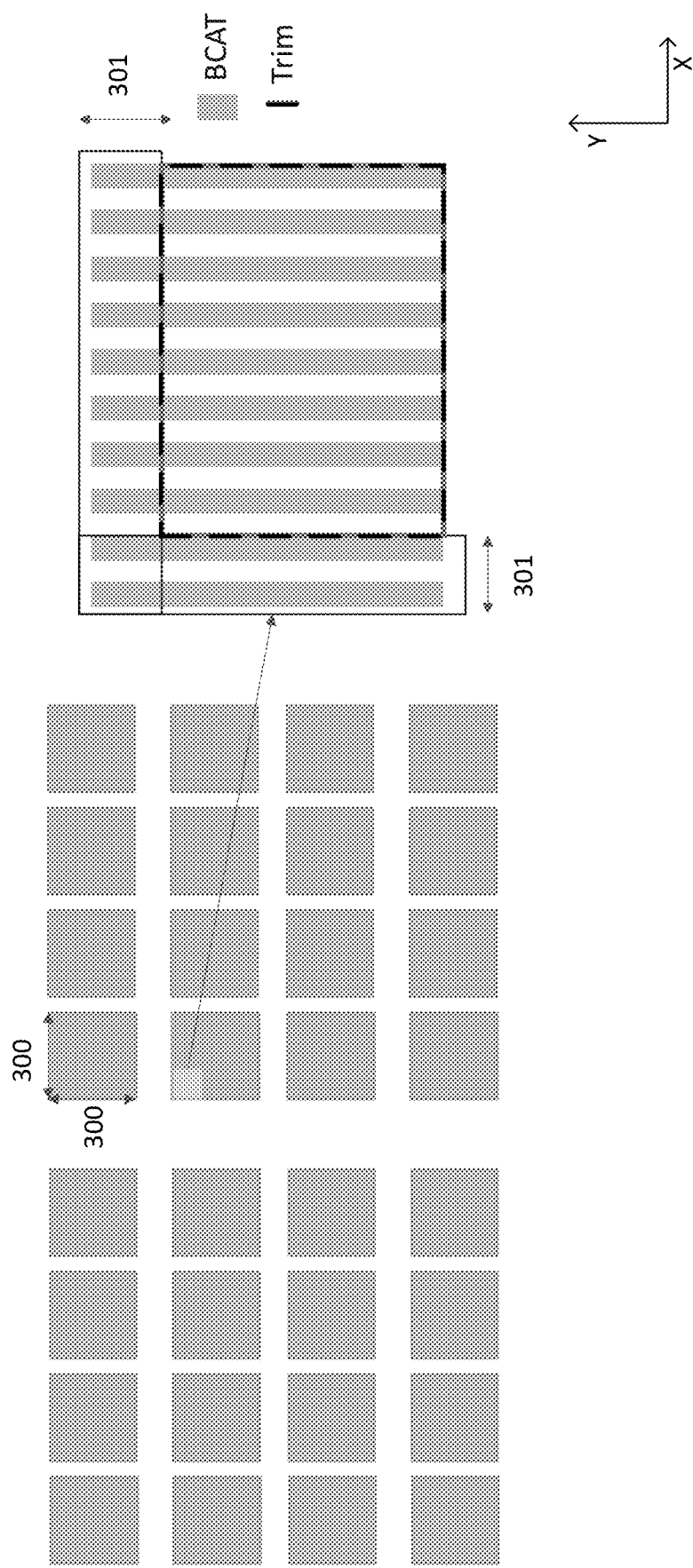
FIG. 1 illustrates exemplary DRAM memory blocks.
Figure 2:
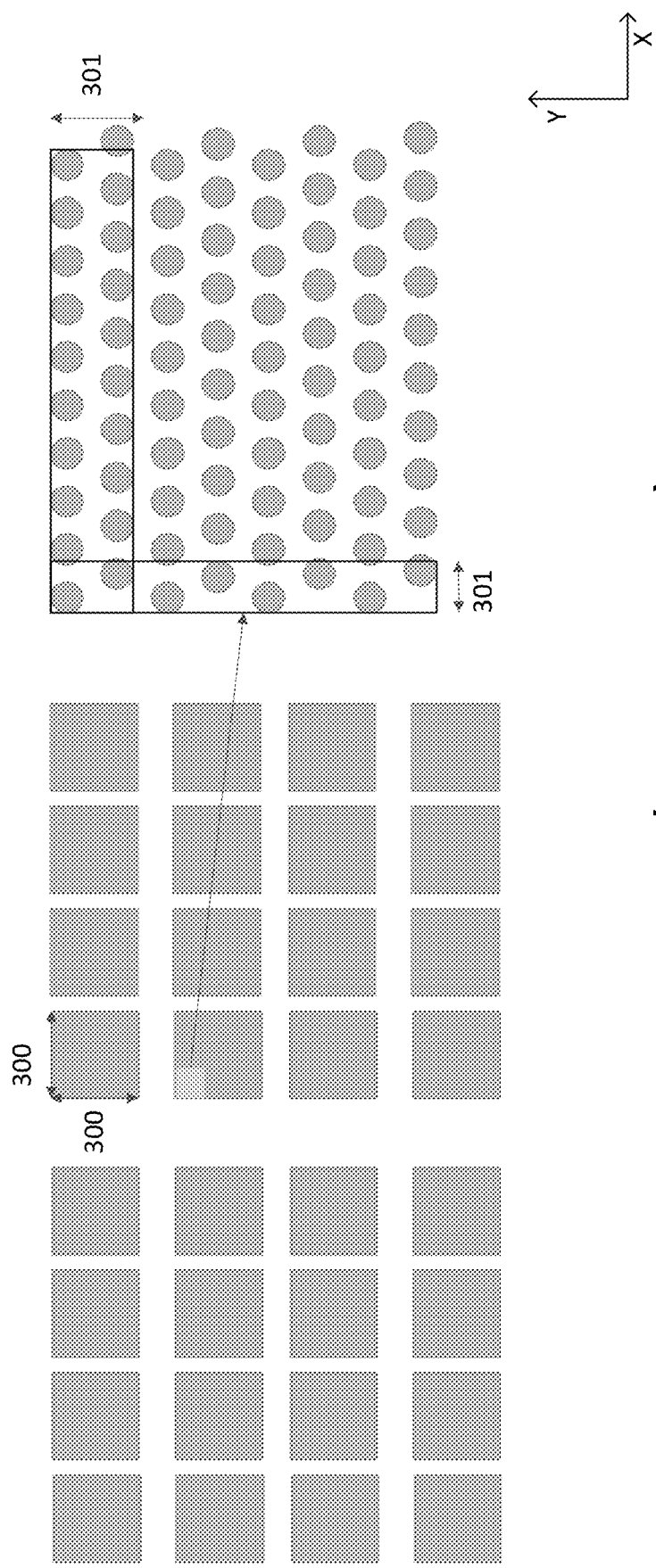
FIG. 2 illustrates exemplary DRAM memory blocks.
Figure 3:
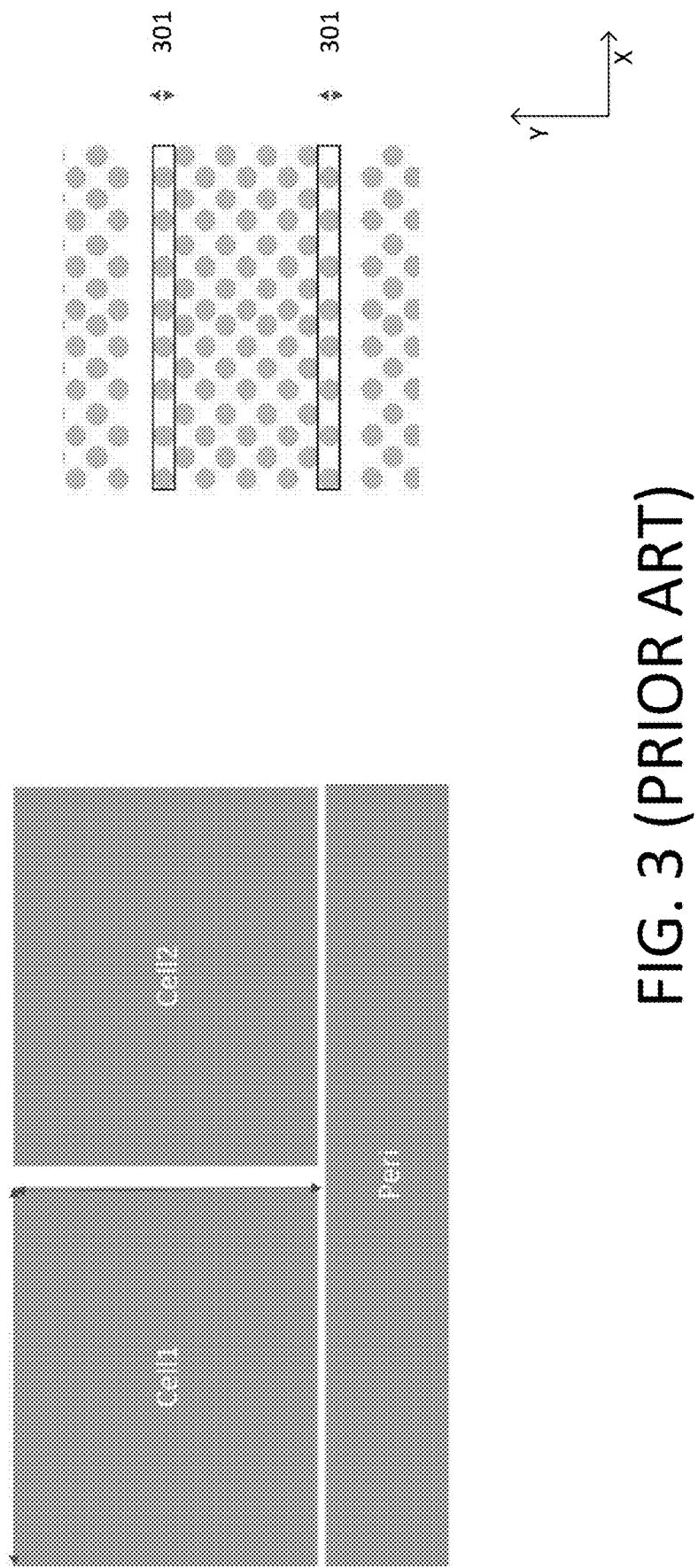
FIG. 3 is exemplary 3D NAND blocks.
Figure 4:
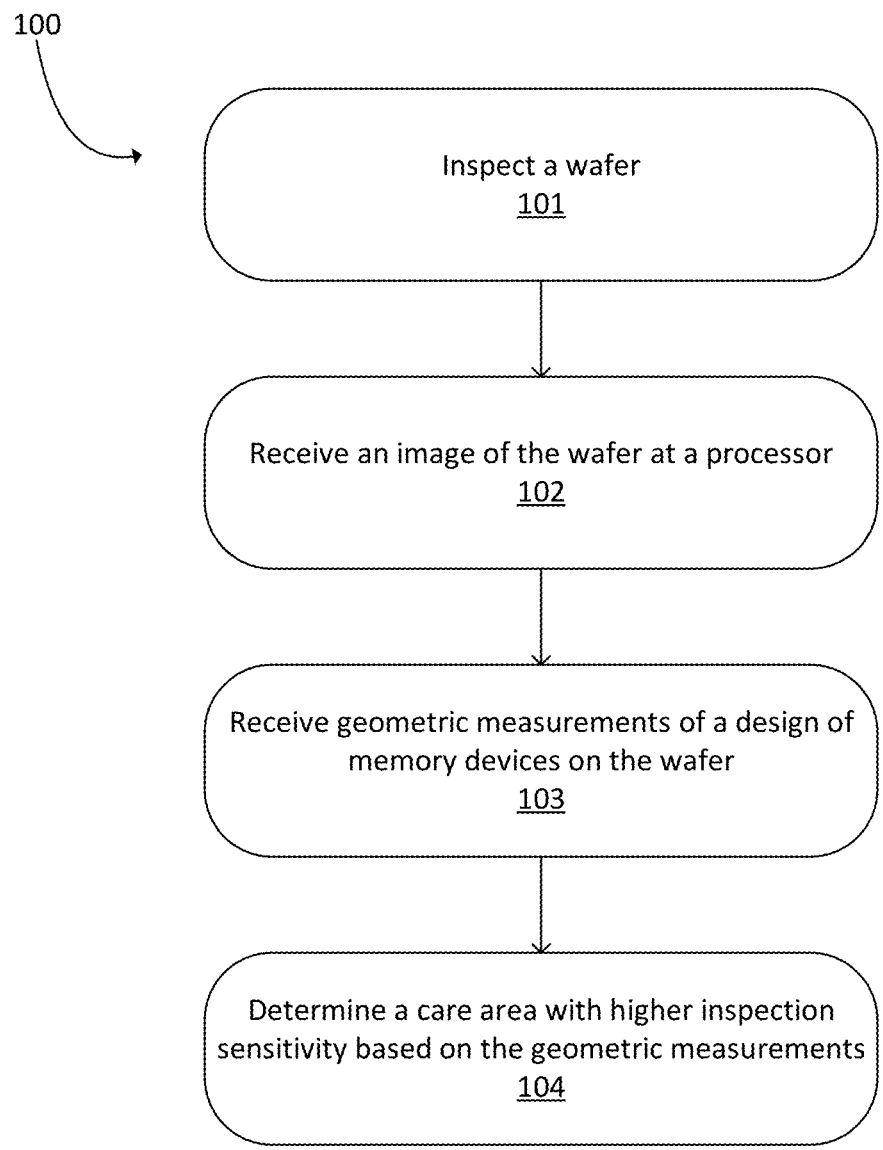
FIG. 4 is a flowchart of an embodiment of a method in accordance with the present disclosure.

FIG. 4 is a flowchart of an embodiment of a method 100. At 101, a wafer is inspected using an inspection tool. An image of the wafer is received at a processor at 102. The image can include devices, such as those illustrated in FIGS. 1-3 or FIG. 5. Geometric measurements of a design of memory devices on the wafer are received at the processor at 103. Using the processor, a care area with higher inspection sensitivity is determined based on the geometric measurements at 104.

In an instance, each of the memory devices in the method 100 is a 3D NAND cell. The geometric measurements can be one or more of a distance between contact rows, a distance between trenches, a location of a dummy area, or other information. The location of a dummy area can be relative to trenches. These geometric measurements can be based on design data for the device or the wafer.

In an example using 3D NAND, the cell pitch in Y-direction can be determined based on design information. Optical images can be used to determine the trench (i.e., the blank area in-between two cell blocks) location and its periodicity, such as by using image intensity or image gray level variation along the X-direction at each point in the Y-direction. The cell pitch in Y-direction based on design information should match with the periodicity extracted from optical images.

The care area can be applied to a contact row of the memory devices using the processor. Thus, cell pitch can be determined from a design in the Y-direction and periodicity can be determined from the image in the Y-direction. A care area can be placed based on where, for example, a trench is.

This embodiment for 3D NAND cells can use design information if it is available. During setup, one or more geometric measurements of one or more 3D NAND cells can be provided. Using design information for inspection, a process invariant algorithm can identify which contact row the defect is coming from and apply different sensitivity to different contact rows. Thus, a sub-region can be inspected. By identifying locations of, for example, trenches, dummy areas, and each contact row and by organizing sensitivity area into sub-regions, better sensitivity can be achieved for 3D NAND cell inspection. Better sensitivity and more relevant 3D NAND inspection can result in yield improvement.

Figure 7:
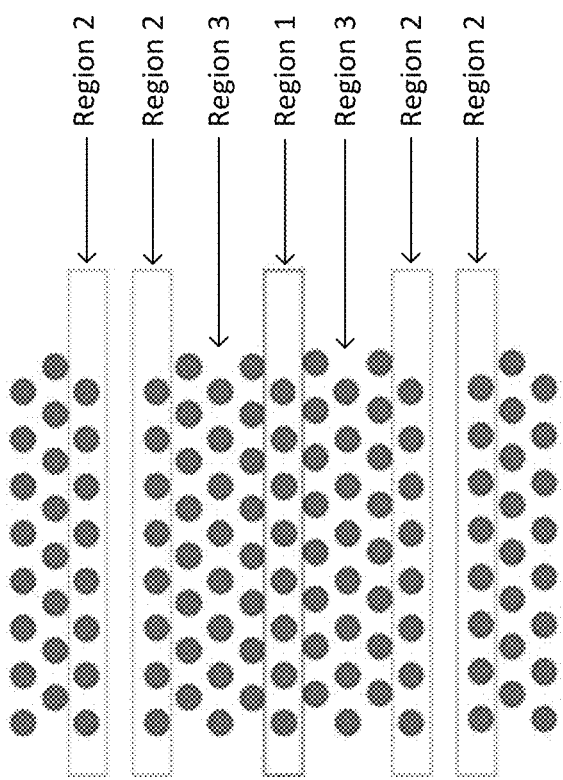
FIG. 7 illustrates different contract rows assigned to different regions.

FIG. 7 illustrates an embodiment assigning different contract rows to different regions. The contact rows can be assigned based on geometric measurement data.

In an instance, each of the memory devices is a DRAM cell. The geometric measurements can be one or more of a cell outline distance to a center of a periphery. The care area can be applied to the memory devices using the processor.

This embodiment for DRAM cells can use design information if it is available. During setup, information regarding cell outline distance to center can be provided for one or more cell regions. This information can be determined based on design information. Using design information, a job size is extended in the X-direction to cover more than two array cells. A sub-swatch that covers page breaks can be found. Page break is the space in-between cell blocks. Cell boundaries can be identified on-the-fly. PDA distortion and location of cell boundary can be propagated on-the-fly to sub-swaths that do not have periphery intersections. In an instance, "on-the-fly" means during run-time or during the inspection process. Trim areas and/or areas of interest (AOI) for critical defects can be placed. The trim areas and/or AOI can be assigned higher sensitivity. These functions can be performed using the processor.

In an instance, the location of the center of the DRAM cell blocks are determined from frame images. Then an offset between page break center from design and calculated page break center from image can be determined. The offset can be applied to the run-time context masks which has the care area definitions of AOIs and cell edges.

Figure 8:
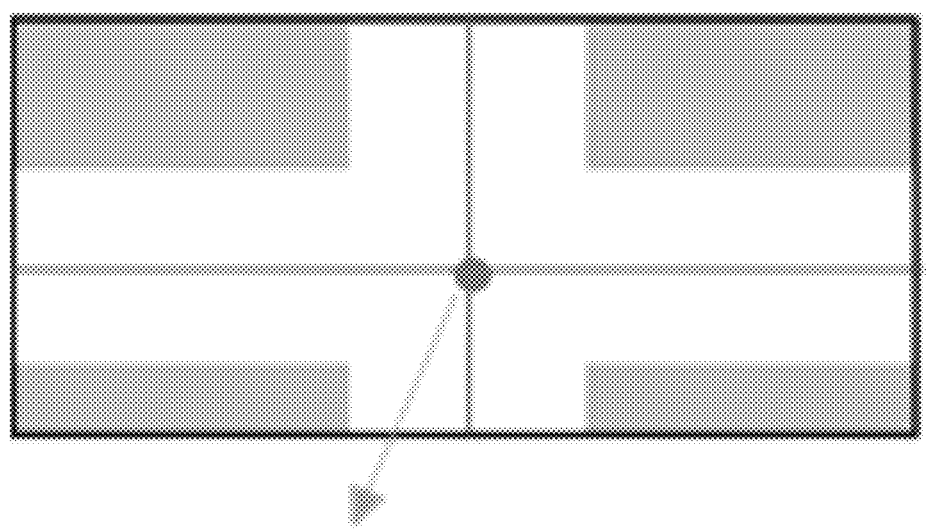
FIG. 8 is illustrates a calculated page break center.

In an instance, a center of a cross-street on the DRAM structure can be used to identify the four corners of four different cell blocks that form a cross-street. This is shown in FIG. 8. This information can be used to anchor a cell edge care area. Different sensitivity can be applied to the care area relative to the rest of the image.

This technique for DRAM cells can be used even if incomplete or little design information is provided. Cell block size can be used instead of or to supplement design data. By identifying outline of cell regions without detailed design information and under light condition with poor PDA quality, better sensitivity can be achieved for DRAM cell inspection. Better sensitivity can result in more relevant DRAM inspection for yield improvement.

When applying the care area to the DRAM memory devices, a job size can be extended in an X-direction to cover at least two array cells. In this instance, the care area can be applied to a trim area and/or an area with critical defects.

Figure 5:
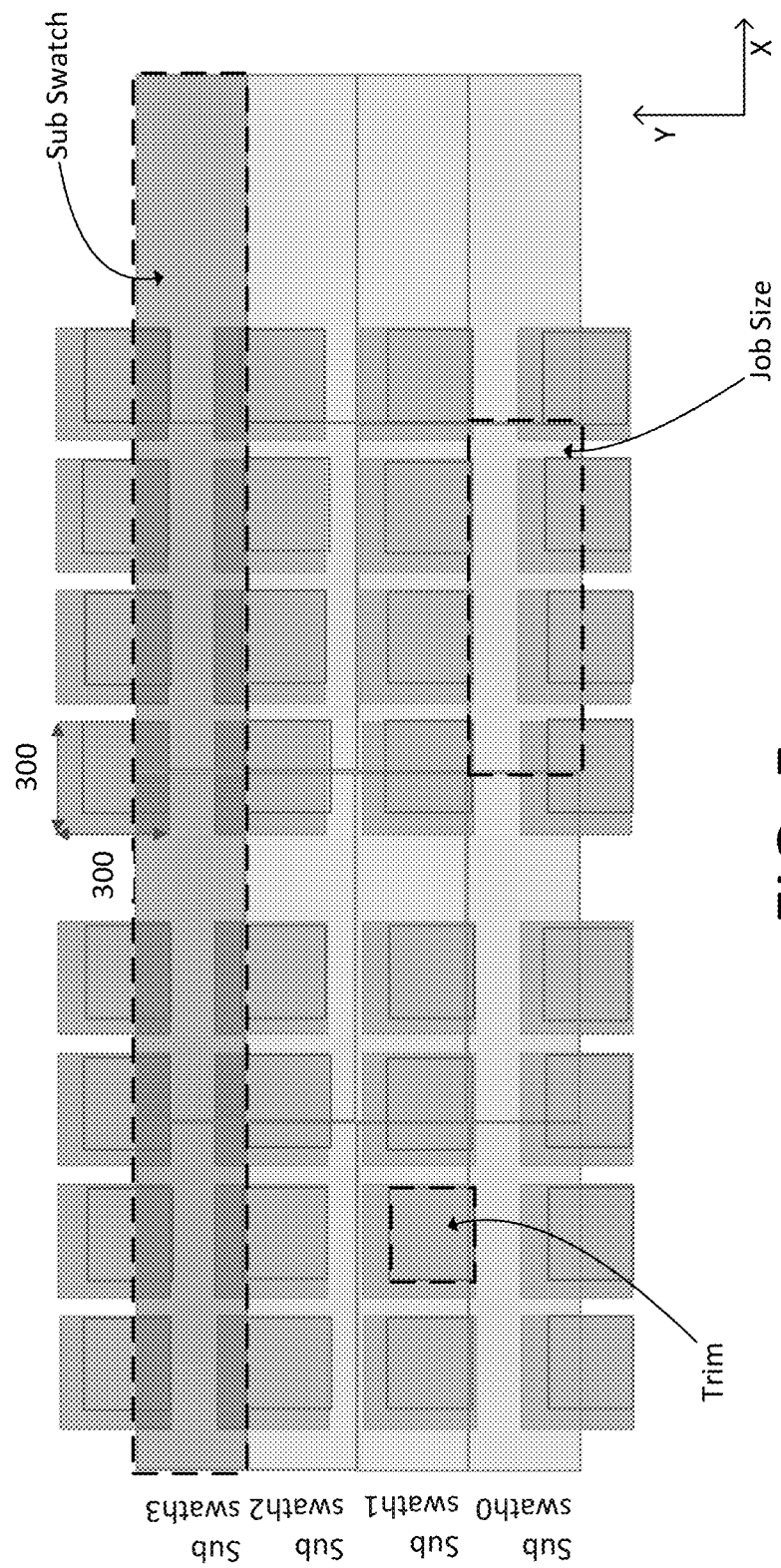
FIG. 5 illustrates an embodiment for DRAM device inspection in accordance with the present disclosure.

FIG. 5 illustrates an embodiment for DRAM device inspection. Cell outline distance to center of periphery information is provided for each cell region. For inspection, a job size is extended in the X-direction to cover more than two array cells. This is shown in FIG. 5 by the shaded rectangles, one of which is outlined with a dotted line in sub swatch 0. A sub-swath which covers page breaks is found and cell boundaries are identified on-the-fly. For example, the sub swatch 3 (one of which is outlined with a dotted line) covers page breaks. PDA distortion and locations of cell boundaries are propagated on-the-fly to sub-swaths that do not have periphery intersections. Trim area (one of which is outlined with a dotted line in sub swatch 1) can be placed and assigned higher sensitivity.

Figure 6:
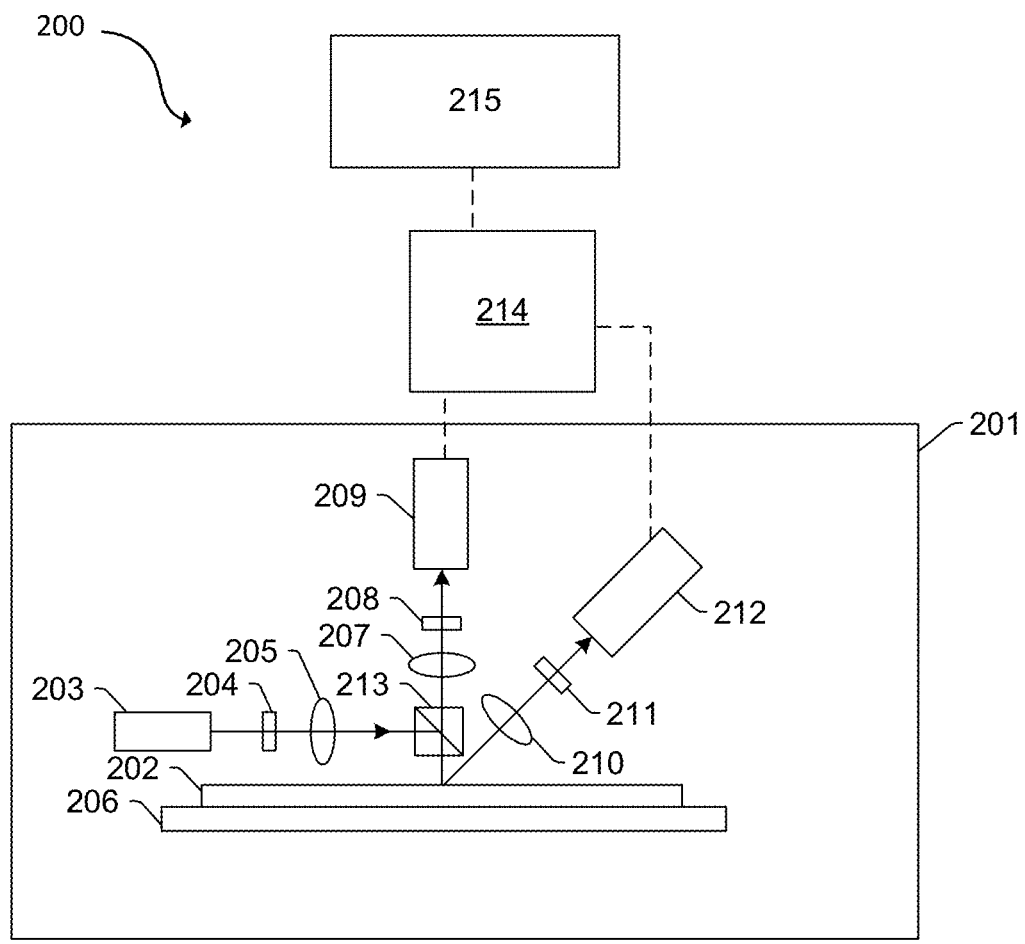
FIG. 6 is an embodiment of a system in accordance with the present disclosure.

FIG. 6 is an embodiment of a system 200, which may be an inspection tool. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art.

In the embodiment of the system 200 shown in FIG. 6, optical based subsystem 201 includes an illumination subsystem configured to direct light to specimen 202. The illumination subsystem includes at least one energy source that can direct energy at a specimen 202. For example, as shown in FIG. 6, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 6, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 6. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 6 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 6) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 6 as a single refractive optical element, it is to be understood that, in practice, lens 205 may include a number of refractive and/or reflective optical elements that in combination focus the light from the optical element to the specimen. The illumination subsystem shown in FIG. 6 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 6 includes two detection channels, one formed by collector 207, element 208, and detector 209 and another formed by collector 210, element 211, and detector 212. As shown in FIG. 6, the two detection channels are configured to collect and detect light at different angles of collection. In some instances, both detection channels are configured to detect scattered light, and the detection channels are configured to detect tight that is scattered at different angles from the specimen 202. However, one or more of the detection channels may be configured to detect another type of light from the specimen 202 (e.g., reflected light). The detector 209 can generate output responsive to the energy that is detected.

As further shown in FIG. 6, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 6 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 6 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 6 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 6 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with an SEM.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be further configured as described herein.

The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to receive an image of the wafer based on the output; receive geometric measurements of a design of a plurality of memory devices on the wafer; and determine a care area with higher inspection sensitivity based on the geometric measurements. Each of the memory devices may be a 3D NAND cell or a DRAM cell. For 3D NAND cells, the geometric measurements is one or more of a distance between contact rows, a distance between trenches, or a location of a dummy area. The processor 214 is configured to apply the care area to a contact row of the memory devices. For DRAM cells, the geometric measurements is one or more of a cell outline distance to a center of a periphery. The processor 214 is configured to apply the care area to the memory devices. The processor 214 can be further configured to extend a job size in an X-direction to cover at least two array cells; determine a sub-swath that covers page breaks and identifies a cell boundary; and determine PDA distortion and location of the cell boundary to another sub-swath without periphery intersections. A care area can be applied to a trim area or an area with critical defects. Other operations described herein also can be performed.

An additional embodiment relates to a non-transitory computer-readable medium storing program instructions executable on a controller for performing a computer-implemented method for inspection as disclosed herein. In particular, as shown in FIG. 6, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

While disclosed with an optical inspection tool, the embodiments disclosed herein also can be used with an electron beam inspection tool. Thus, the energy source can produce an electron beam instead of a light beam.

While disclosed with 3D NAND and DRAM devices, other memory devices or other semiconductor structures also can benefit from the embodiments disclosed herein.

The X-direction and Y-direction can be reversed from the examples illustrated herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   an inspection tool including:
      an energy source configured to generate energy that is directed to a wafer; and
      a detector configured to detect energy from the wafer and to generate output responsive to the energy that is detected; and
   a processor in electronic communication with the inspection tool, wherein the processor is configured to:
      receive an image of the wafer based on the output;
      receive geometric measurements of a design of a plurality of memory devices on the wafer, wherein the geometric measurements of the design are provided in design data of a device on the wafer, and wherein each of the memory devices is a DRAM cell;
      determine a care area with higher inspection sensitivity based on the geometric measurements;
      apply the care area to the memory devices;
      extend a job size in an X-direction to cover at least two array cells;
      determine a sub-swath that covers page breaks and identifies a cell boundary; and
      determine pattern-design alignment distortion and location of the cell boundary to another sub-swath without periphery intersections.

2. The system of claim 1, wherein the geometric measurements are one or more of a cell outline distance to a center of a periphery.

3. The system of claim 1, wherein the care area is applied to a trim area.

4. The system of claim 1, wherein the care area is applied to an area with critical defects.

5. A method comprising:
   inspecting a wafer using an inspection tool;
   receiving, at a processor, an image of the wafer from the inspection tool;
   receiving, at the processor, geometric measurements of a design of a plurality of memory devices on the wafer, wherein the geometric measurements of the design are provided in design data of a device on the wafer, and wherein each of the memory devices is a DRAM cell; and
   determining, using the processor, a care area with higher inspection sensitivity based on the geometric measurements;
   applying the care area to the memory devices using the processor;
   extending a job size in an X-direction to cover at least two array cells using the processor;
   determining a sub-swath that covers page breaks and identifies a cell boundary using the processor; and
   determining pattern-design alignment distortion and location of the cell boundary to another sub-swath without periphery intersections using the processor.

6. The method of claim 5, wherein the geometric measurements are one or more of a cell outline distance to a center of a periphery.

7. The method of claim 5, wherein the care area is applied to a trim area.

8. The method of claim 5, wherein the care area is applied to an area with critical defects.

* * * * *